United States Patent
Abe (10) Patent No.: US 7,718,515 B2
(45) Date of Patent: May 18, 2010

(54) METHOD FOR FABRICATING SEMICONDUCTOR DEVICE

(75) Inventor: Kazuhide Abe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/073,492

(22) Filed: Mar. 6, 2008

(65) Prior Publication Data
US 2008/0233716 A1    Sep. 25, 2008

(30) Foreign Application Priority Data
Mar. 20, 2007  (JP) .............................. 2007-071926

(51) Int. Cl.
*H01L 21/20* (2006.01)
(52) U.S. Cl. .............................. 438/479; 117/2; 257/77; 257/622; 257/E21.317; 257/E21.325
(58) Field of Classification Search .................. 438/471, 438/476; 257/E21.317, 325
See application file for complete search history.

(56) References Cited

FOREIGN PATENT DOCUMENTS

| JP | 10-125905 | | 5/1998 |
| JP | 10125905 | * | 5/1998 |
| JP | 2005-350278 | | 12/2005 |

\* cited by examiner

*Primary Examiner*—Charles D Garber
*Assistant Examiner*—Yasser A Abdelaziez
(74) *Attorney, Agent, or Firm*—Rabin & Berdo, PC

(57) ABSTRACT

The principal objects of the present invention are to provide structure of a semiconductor device capable of reducing a bowing of a wafer, and a method for fabricating the semiconductor device. The present invention is applied to a semiconductor device, which is fabricated with a semiconductor substrate having a silicon carbide (SiC) film. The method includes the steps of: forming the SiC film on a semiconductor wafer; discriminating a deformation condition of the semiconductor wafer; and forming grooves in the SiC film, the grooves having a shape determined in accordance with the deformation condition of the semiconductor wafer.

9 Claims, 11 Drawing Sheets

METHOD FOR FABRICATING SEMICONDUCTOR DEVICE

CROSS REFERENCE TO RELATED APPLICATION

This application claims the priority of Application No. 2007-071926, filed on Mar. 20, 2007 in Japan, the subject matter of which is incorporated herein by reference.

TECHNICAL FIELD OF THE INVENTION

This invention relates to a semiconductor device fabricated by using a semiconductor substrate having a silicon carbide (SiC) film, and a method for fabricating the semiconductor device.

BACKGROUND OF THE INVENTION

A power device using Si is employed in the field of power electronics such as motor control of a motor vehicle and an electric train, and the like. The insulation resistance of the power device depends on the performance limit of the power device. Therefore, there has been required the material having a wider band gap and higher breakdown field strength than Si. Silicon carbide (SiC), GaN, or diamond all has a wider band gap and higher breakdown field strength than Si. In addition, such material has the advantages such as a high saturated drift velocity, high stability at a high temperature, and the like.

In comparison of physical properties of SiC with those of Si, SiC is about two to three times wider in band gap, about one digit higher in breakdown field strength, and several times higher in saturated drift velocity than Si. Moreover, in comparison with another wide band gap semiconductor, SiC has superior matching with silicon based process, because $SiO_2$ can be made from SiC by thermal oxidation. Alternatively, because use of SiC allows a user to control p and n type conduction by impurity doping, SiC has advantages in terms of practical use.

A SiC single-crystal epitaxial film is grown with chemical vapor deposition (CVD) method, a sublimation method, or the like. Film growth with CVD method is carried out using $SiH_4$, $C_3H_8$, and $H_2$ at a temperature more than 1,500 degrees C. in a hot-wall CVD reactor. Also, SiC powder confined in a crucible is heated up to nearly 2,000 degrees C. to grow SiC on a substrate in the sublimation method. A sublimation method has advantageously a fast growth rate in comparison with CVD method.

Although a SiC epitaxial film can be formed by various methods, defects have not been reduced sufficiently for the required element performance. The crystal defect represented by dislocation is a factor in degradation of element characteristics such as a withstanding pressure and the like. Therefore, various contrivances have been made. Japanese Patent Laid-Open publication No. 2005-350278 is the one example.
Patent document 1: Japanese Patent Laid-Open publication No. 2005-350278

In the procedure of forming a SiC element, the thermal treatment at high temperatures of around 1,200 to 1,800 degrees C. is necessary for activation of dopants and the like. Recrystallization can spread a defect into a high quality region with few defects and furthermore can reduce the element yield.

Also, a large-diameter semiconductor wafer (with a diameter of, for example, 6 inches) is currently required, and therefore a bowing of a SiC substrate having a SiC film formed by epitaxial growth becomes a serious problem. It is necessary to use a stepper (reduction projection exposure apparatus) for the patterning equal to or less than 1 μm (micrometer). The SiC substrate with a large bowing equal to or more than several tens of μm (micrometer) makes a fine pattern formation difficult.

OBJECTS OF THE INVENTION

The present invention has been made in view of the circumstances as described above. The principal objects of the present invention are to provide the structure of a semiconductor device capable of reducing a bowing of a wafer, and a method for fabricating the semiconductor device.

Other objects of the present invention are to provide the structure of a semiconductor device capable of maintaining an element-forming region with high quality even after a SiC element forming process, and to provide a method for fabricating the semiconductor device.

Additional objects, advantages and novel features of the present invention will be set forth in part in the description that follows, and in part will become apparent to those skilled in the art upon examination of the following or may be learned by practice of the present invention. The objects and advantages of the present invention may be realized and attained by means of the instrumentalities and combinations particularly pointed out in the appended claims.

SUMMARY OF THE INVENTION

According to a first aspect of the present invention, there is provided a method for fabricating a semiconductor device to be fabricated by using a semiconductor substrate having a silicon carbide (SiC) film, the method comprising the steps of: forming the SiC film on a semiconductor wafer; discriminating a deformation condition of the semiconductor wafer; and forming grooves in the SiC film, the grooves having a shape determined in accordance with the deformation condition of the semiconductor wafer.

Here, when there is a curved bowing that is extending in one direction of the semiconductor wafer, the grooves are preferably a plurality of slit-shaped grooves extending substantially perpendicularly to the longitudinal direction in which the bowing extends. That is, the direction without the bowing of the semiconductor wafer is preferably in parallel with the short side (perpendicular to the long side) of the grooves.

Alternatively, when there is a concave or convex bowing around the center of the semiconductor wafer, the grooves include preferably first grooves extending in a first direction, and second grooves extending in a second direction perpendicular to the first direction.

According to a second aspect of the present invention, a semiconductor device is fabricated by using a semiconductor wafer on which a silicon carbide (SiC) film was formed. Grooves are made in the SiC film. The grooves are a plurality of slit-shaped grooves extending substantially perpendicularly to the longitudinal direction in which a curved bowing extends in one direction of the semiconductor wafer.

According to a third aspect of the present invention, a semiconductor device is fabricated by using a semiconductor wafer on which a silicon carbide (SiC) film was formed. Grooves are made in the SiC film. The grooves include preferably first grooves extending in a first direction, and second grooves extending in a second direction perpendicular to the first direction.

The grooves are preferably made around a crystal-defect concentrated region in the silicon carbide (SiC) film. Alternatively, the grooves are preferably made to remove the crystal-defect concentrated region in the SiC film.

The crystal-defect concentrated region may be a region having crystal defects more than $10^4$ number/cm$^2$.

The crystal-defect concentrated region can be intentionally formed by a predetermined method. In a SiC single crystal, adjustment of a growth plane can concentrate crystal defects such as dislocation and the like. These crystal defects can be concentrated further during growth of a film. On this account, a region other than a crystal-defect concentrated region becomes a high quality region in which crystal defects such as dislocation and the like are few.

In accordance with the present invention with the structure as described above, stresses of the silicon carbide (SiC) film on a semiconductor wafer can be relieved to reduce a bowing (deformation) of the semiconductor wafer. Also, a shape of the wafer bowing is discriminated in advance by a simulation in addition to an actual measurement. In accordance with the shape, an optimal groove shape and direction can be determined.

Alternatively, the grooves are made around the crystal-defect concentrated region in the silicon carbide (SiC) film, and therefore the crystal-defect concentrated region is separated spatially from a high quality region with few defects, by the grooves. Also, the grooves are made in the SiC film such that the crystal-defect concentrated region in the SiC film is removed. As a result, it is possible to restrain the crystal defect expansion (propagation) that the crystal-defect concentrated region in the SiC film effects during recrystallization of the SiC film, even if thermal treatment such as dopant activation or the like is performed at a high temperature.

DESCRIPTION OF REFERENCE NUMERALS

10 SEMICONDUCTOR WAFER
101, 201 SiC SUBSTRATE
102, 202 SiC FILM (EPITAXIAL GROWTH FILM)
103, 203 CRYSTAL-DEFECT CONCENTRATED REGION
107, 207, 307 GROOVES

DETAILED DISCLOSURE OF THE INVENTION

In the following detailed description of the preferred embodiments, reference is made to the accompanying drawings which form a part hereof, and in which is shown by way of illustration specific preferred embodiments in which the present invention may be practiced. These preferred embodiments are described in sufficient detail to enable those skilled in the art to practice the present invention, and it is to be understood that other preferred embodiments may be utilized and that logical, mechanical and electrical changes may be made without departing from the spirit and scope of the present invention. The following detailed description is, therefore, not to be taken in a limiting sense, and scope of the present invention is defined only by the appended claims.

Figure 1:
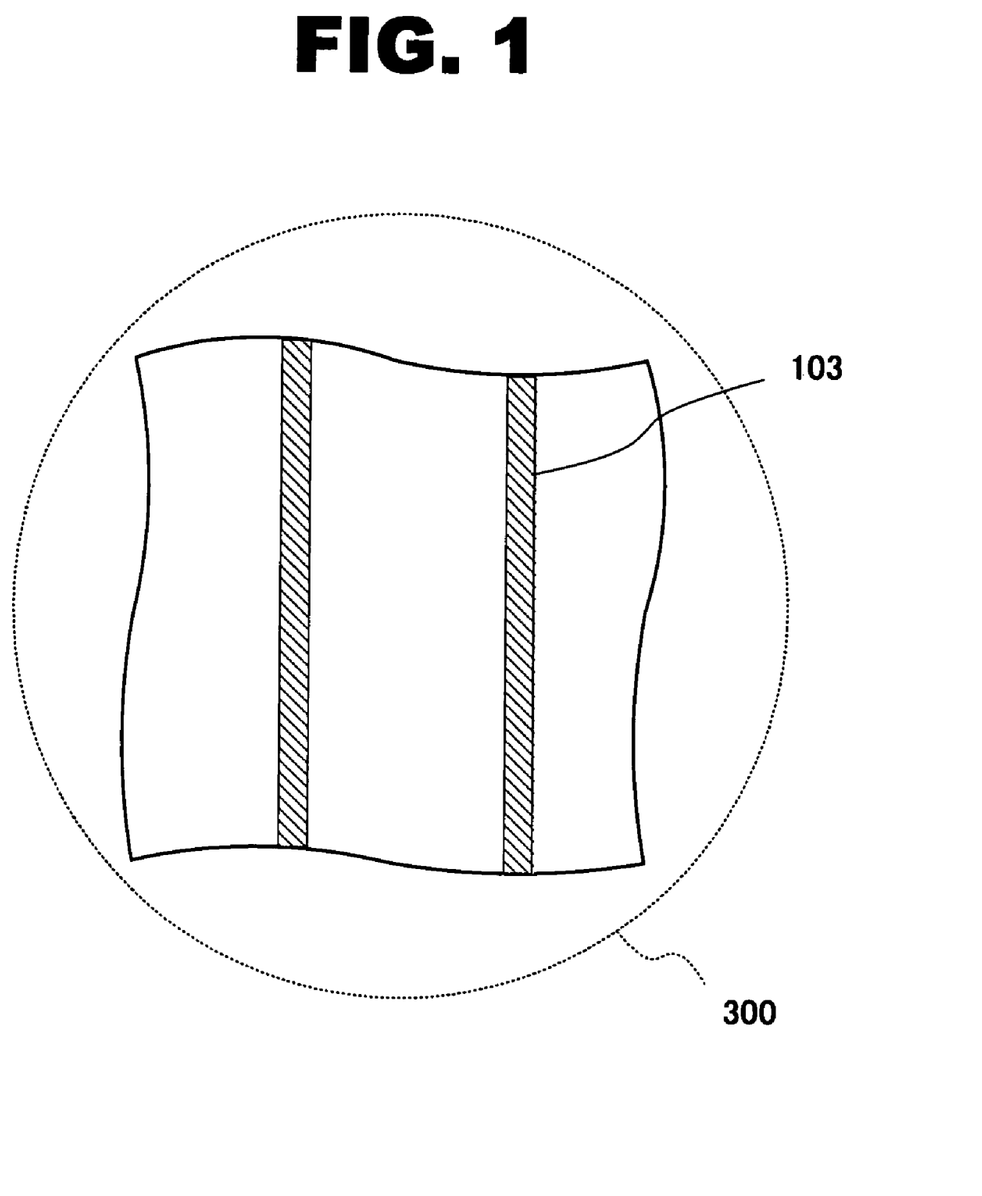
FIG. 1 is a schematic plan view showing structure of a semiconductor wafer according to embodiments of the present invention.

FIG. 1 is a schematic plan view showing, in part, structure of a semiconductor wafer 10 according to embodiments of the present invention.

In FIG. 1, reference numeral 103 indicates a crystal-defect concentrated region. Micropipe, screw dislocation, edge dislocation are included in crystal defects. The crystal-defect concentrated region 103 can be formed intentionally by a predetermined method. In a silicon carbide (SiC) single crystal, adjustment of the growth plane can concentrate crystal defects such as dislocation and the like. These crystal defects can be concentrated further during growth of a film. On this account, a region other than a crystal-defect concentrated region becomes a high quality region in which crystal defects such as dislocation and the like are few.

Figure 2A:
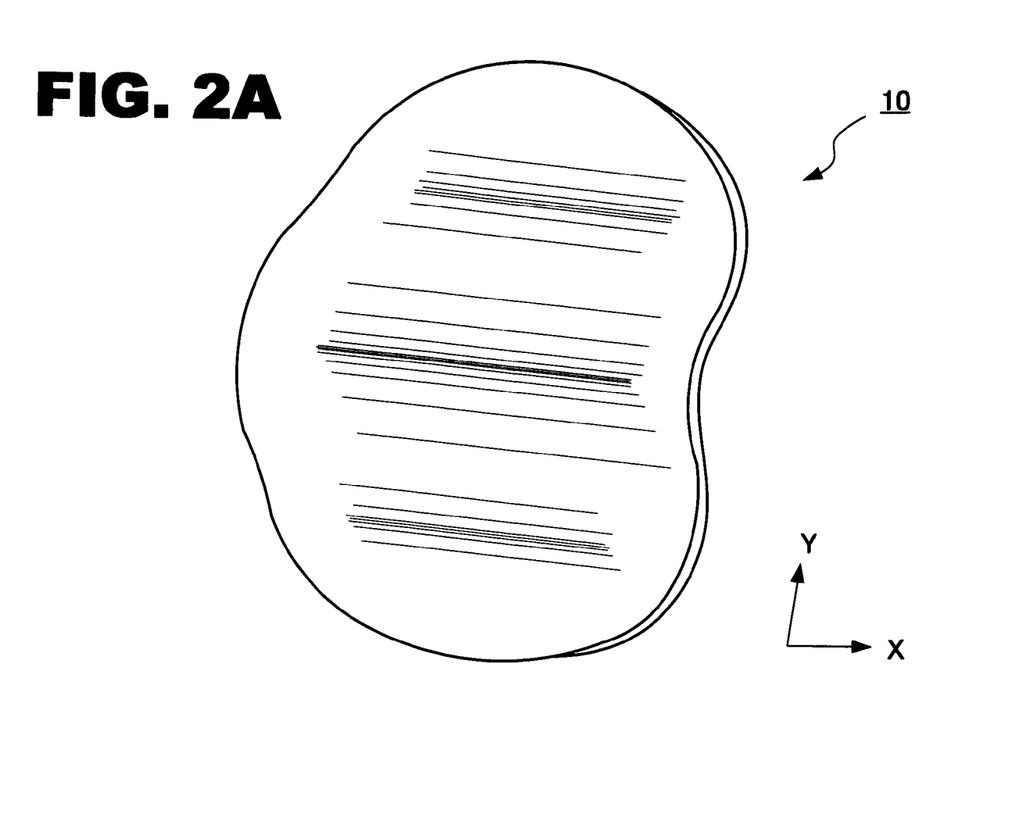
FIG. 2A shows a curved (saddle-shaped) bowing that is extending in one direction of a semiconductor wafer on which a silicon carbide (SiC) film was formed.
Figure 2B:
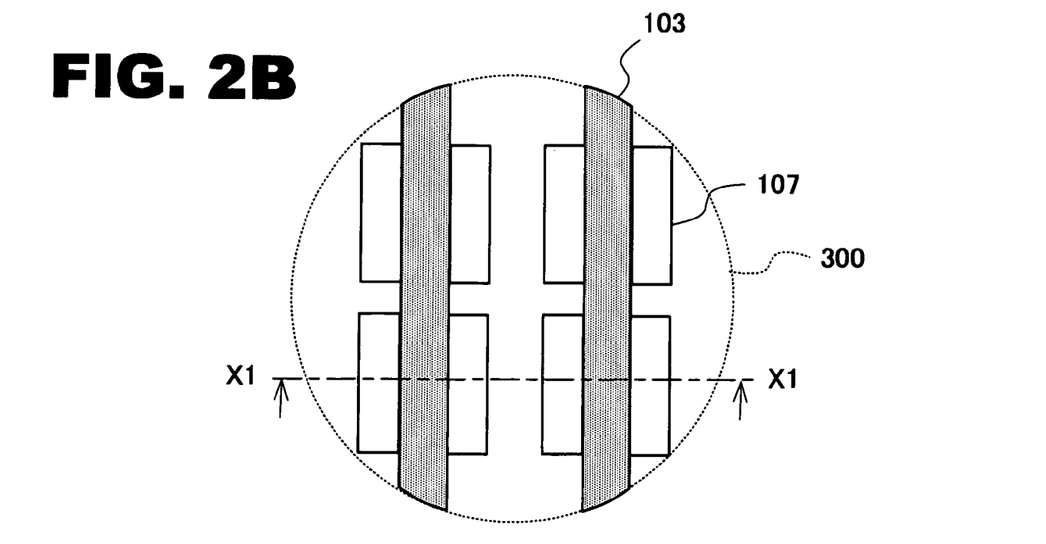
FIG. 2B, when a semiconductor wafer has a bowing as shown in FIG. 2A, is a figure showing arrangement of grooves made in a silicon carbide (SiC) film, and enlarges and shows the dotted line circle in FIG. 1.

FIG. 2A shows a curved (saddle-shaped) bowing that is extending in one direction (in the direction of Y) of the semiconductor wafer 10 on which a silicon carbide (SiC) film was formed. FIG. 2B is a figure showing arrangement of grooves 107 to be made in a SiC film 102, when the semiconductor wafer 10 has the bowing as shown in FIG. 2A. Also, FIG. 2B is generally corresponding to the dotted line circle 300 in FIG. 1. The grooves 107 are a plurality of slit-shaped grooves extending substantially perpendicularly to the longitudinal direction in which the bowing extends. That is, the direction X without the bowing of the semiconductor wafer 10 is in parallel with the short side (perpendicular to the long side) of the grooves.

Although the following will describe the case where the crystal-defect concentrated region 103 is intentionally formed in the silicon carbide (SiC) film 102, this embodiment can be applicable, even when the crystal-defect concentrated region 103 is not intentionally formed in the SiC film 102. In this case, the shape and direction of the grooves 107 are determined in accordance with the direction of bowing, regardless of the crystal-defect concentrated region.

The first embodiment of the present invention will be described. Here, a method for fabricating a DiMOS that has a silicon carbide (SiC) film formed by epitaxial growth on a SiC substrate will be partially described. The SiC film has the grooves made in a portion adjacent to a region in which DiMOSFET (Double-Implanted MOSFET) is not formed.

Figure 3A:
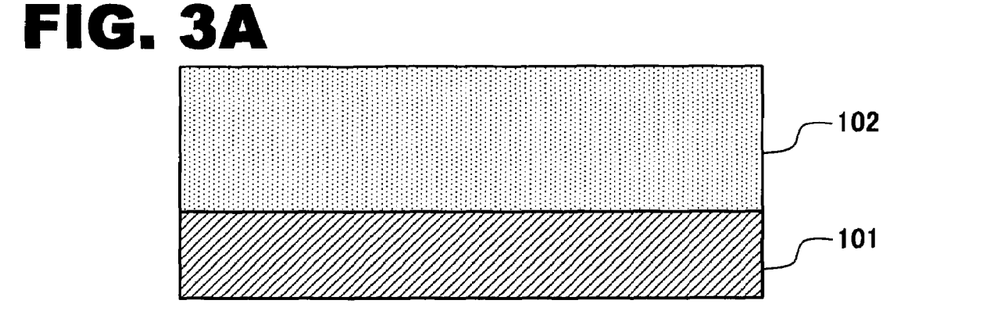
FIGS. 3A to 3C are cross-sectional views showing the procedure for fabricating a semiconductor device according to Embodiment 1 of the present invention.

First, a SiC substrate 101 on which the silicon carbide (SiC) film 102 was formed is prepared, in the process as shown in FIG. 3A. The SiC film 102 is formed by epitaxial growth on the SiC substrate 101, and has, for example, a thickness of 15 μm (micrometer). The surface of the SiC film 102 is etched by chemical mechanical polishing (CMP) method or the like, and then the flat surface is formed.

Figure 3B:
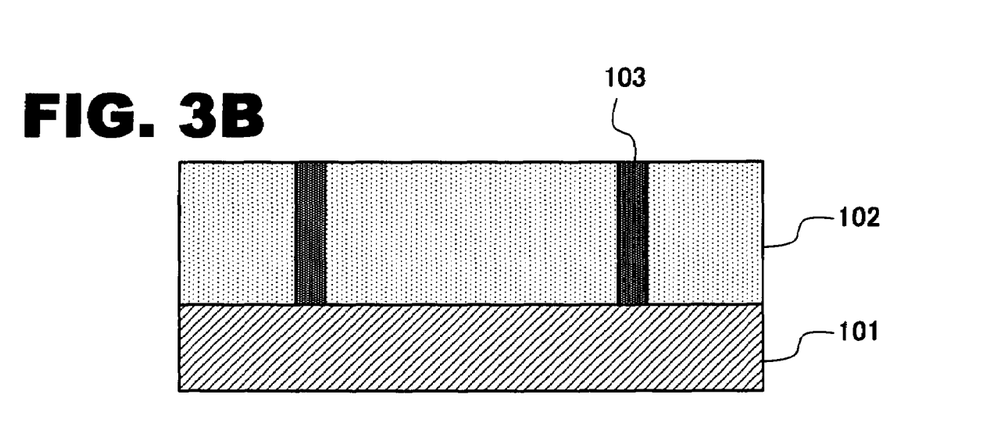

Here, crystal defects such as micropipe, screw dislocation, edge dislocation and the like are formed in the SiC film 102. Reference numeral 103 (as shown in FIG. 3B) indicates this crystal-defect concentrated region. Also, the crystal-defect concentrated region 103 can be formed intentionally by a predetermined method. In a SiC single crystal, adjustment of a growth plane can concentrate crystal defects such as dislocation and the like. These crystal defects can be concentrated further during growth of a film. On this account, a region other than a crystal-defect concentrated region becomes a high quality region in which crystal defects such as dislocation and the like are few.

Figure 3C:
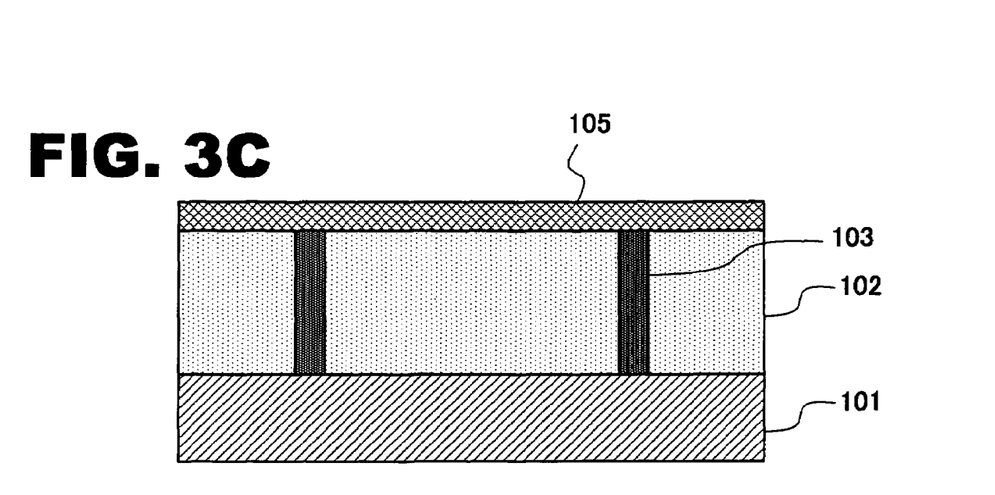
Figure 4D:
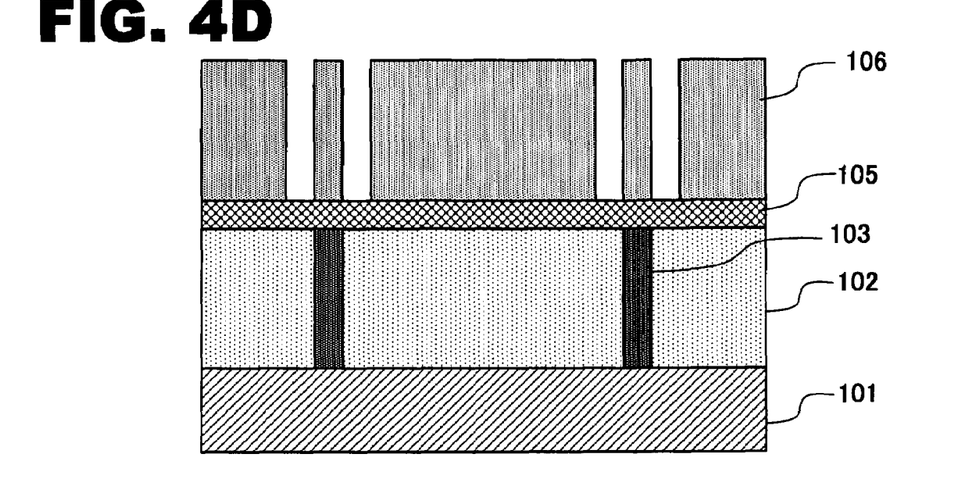
FIGS. 4D to 4F are cross-sectional views showing the procedure for fabricating a semiconductor device according to Embodiment 1 of the present invention.

Next, an oxide film 105 with a thickness of 2 μm (micrometer) that is used as mask for making grooves is formed on the SiC film 102, in the process as shown in FIG. 3C. Subsequently, a resist film 106 is patterned by a photolithography process, as shown in FIG. 4D. Also, the oxide film 105 is formed by chemical vapor deposition (CVD) method under a reduced pressure atmosphere at a reactor temperature of 700 degrees C. using a $Si(OC_2H_5)_4$ gas. The region 103 may exist, in a portion in the SiC film 102, not only alone but also plural in a cluster. If the region 103 exist plural in a cluster, an opening part is formed in a portion adjacent to the outermost region of the plural regions. Also, a width of the region 103 can be around 100 μm (micrometer).

Figure 4E:
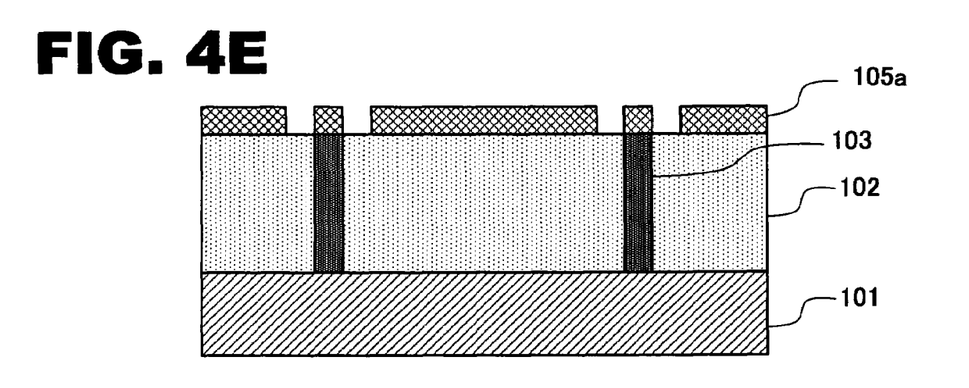

Then, in order to form grooves using the oxide film 105 as mask, an oxide film mask 105a is formed by performing plasma etching via the resist film 106 as mask in the mixed gases of $CHF_3$, $CF_4$, and Ar (as shown in FIG. 4E).

Figure 4F:
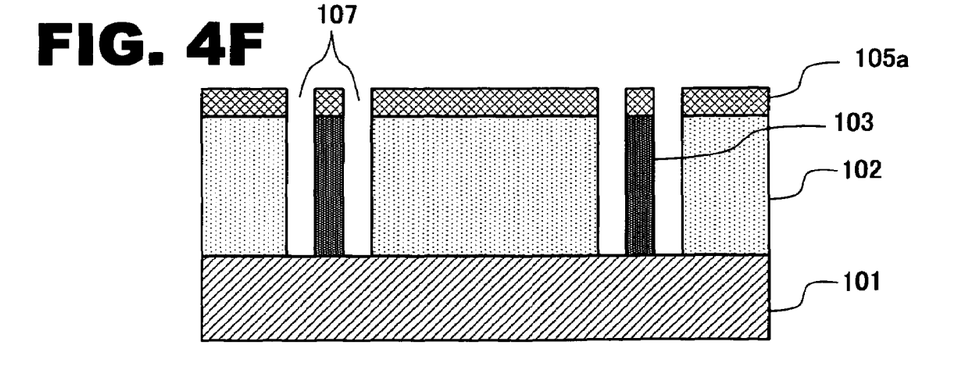

Subsequently, the semiconductor wafer 10 is transferred to another etching apparatus, and then plasma etching is performed via the oxide mask 105a in a $SF_6$ gas. Thereafter, the grooves 107 with, for example, a width of about 2 μm (micrometer) and a depth of about 15 μm (micrometer) are made in a region in which DiMOS (Double-Implanted MOS) is not formed and which exists in the SiC film 102 (as shown in FIG. 4F). Therefore, the crystal-defect concentrated region 103 is separated from a high quality region with few defects by the grooves 107.

Figure 5G:
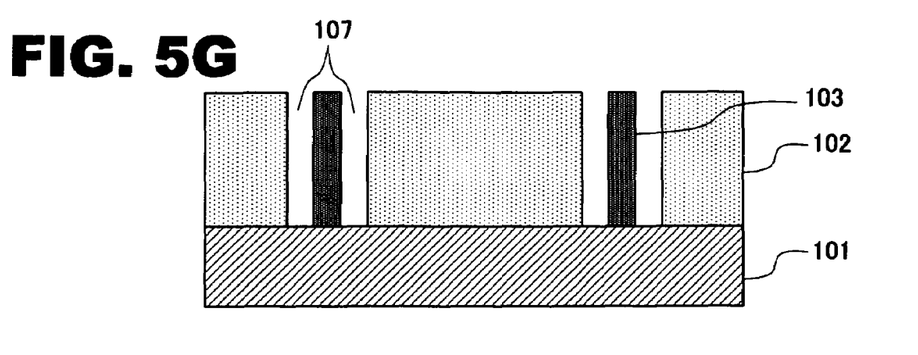
FIGS. 5G to 5I are cross-sectional views showing the procedure for fabricating a semiconductor device according to Embodiment 1 of the present invention.

Then, the structure as shown in FIG. 5G is formed after removing the resist film by ashing and removing the oxide film mask 105a by HF.

Figure 5H:
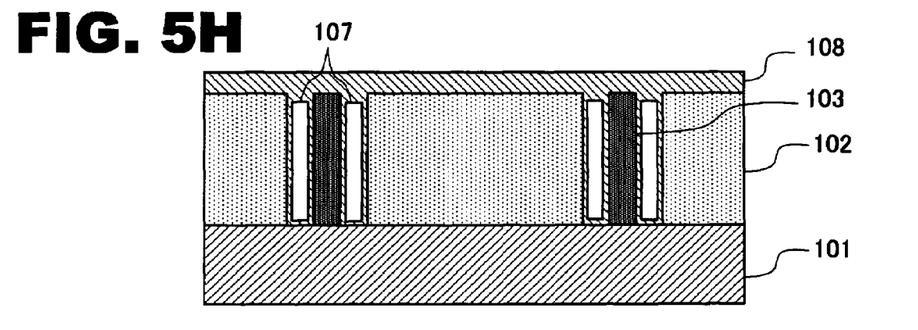

Next, an oxide film 108 with a thickness of 1.5 μm (micrometer) is formed on the SiC film 102 in which the grooves 107 was made, in the process as shown in FIG. 5H. The oxide film 108 was formed by plasma CVD method at the flow rates of 100 sccm for $TEOS_2$, 1000 sccm for $O_2$, and 100 sccm for Ar, at a substrate temperature of 400 degrees C., at a RF power of 400 W. A thick film can be formed at a high throughput by using plasma CVD method in place of thermal CVD method. However, an oxide film formed by plasma CVD method is not able to cover completely the grooves 107, and a cavity is formed in the grooves 107.

Figure 5I:
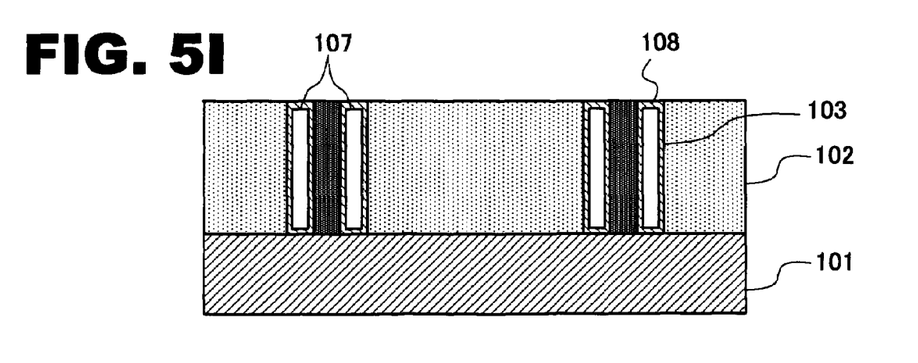

Subsequently, the oxide film 108 is removed by CMP method and remained only in the grooves 107, in the process as shown in FIG. 5I.

Figure 6J:
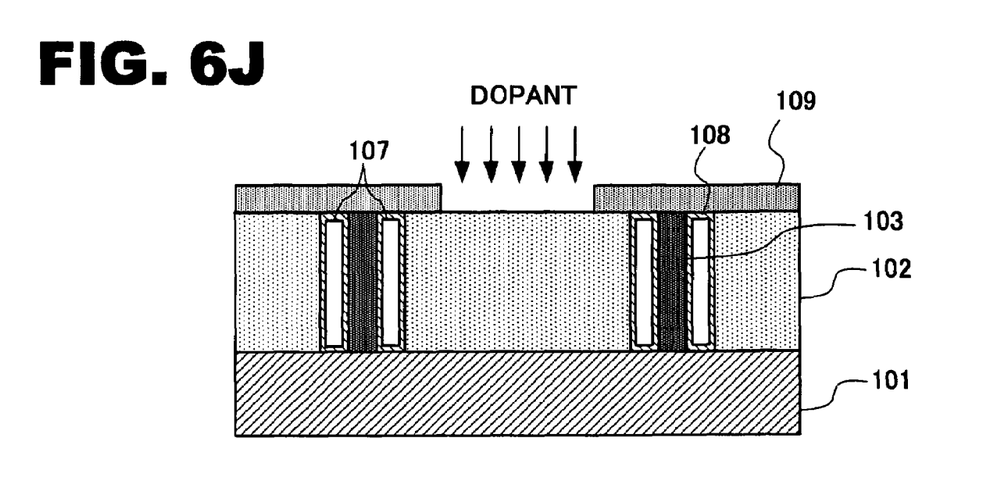
FIGS. 6J and 6K are cross-sectional views showing the procedure for fabricating a semiconductor device according to Embodiment 1 of the present invention.

Then, an oxide film 109 with a thickness of 2 μm (micrometer) that is used as mask for dopant implantation is formed on both the SiC substrate 101 and the SiC film 102 that has the grooves 107. A formation method and condition of the oxide film 109 are the same as those of the oxide film 105. Next, an opening through which dopant implantation is performed is formed in a predetermined region of the oxide film 109 by well-known photolithography and dry etching techniques (as shown in FIG. 6J). Subsequently, multi-step implantation is carried out using nitrogen (N) or phosphorous (P) for an n-type dopant and aluminum (Al) or boron (B) for an p-type dopant, at energies of several tens keV to several tens MeV.

Figure 6K:
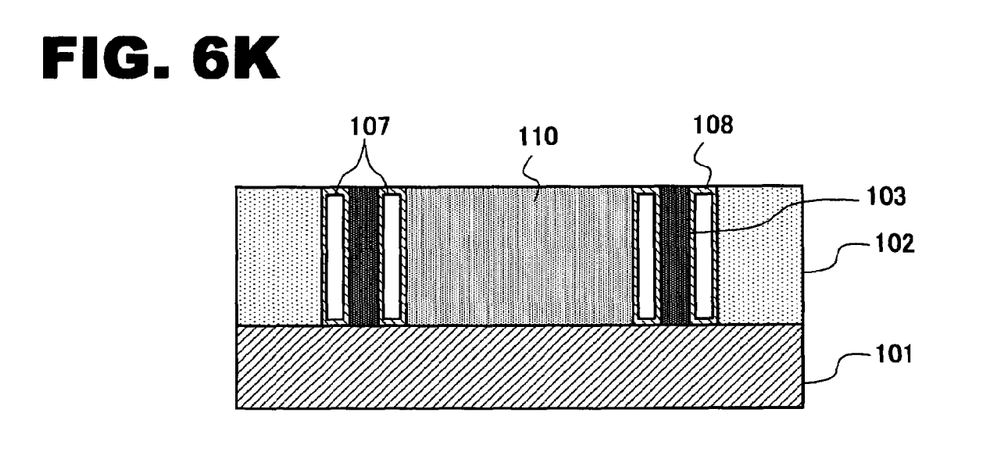

After dopant implantation, the film 109 used as mask for dopant implantation is removed by HF and the process from forming to removing a mask is repeated, as shown in FIG. 6K. As a result, a well or source region is formed. An activating thermal treatment after dopant implantation is performed per each dopant implantation or only after the entire dopant implantation. The treatment condition is at a temperature of 1200 to 1800 degrees C. under an Ar atmosphere for 1 to 30 sec. This treatment restores electrical activation of dopant and damage of an implantation portion in the SiC film 102. Also, when the film 109 used as mask for dopant implantation is removed in the above-described process, the grooves may remain covered by the oxide film 108 without the same process as indicated in FIG. 5I.

As described above, grooves are made in parallel with a constant direction in SiC film 102 that was formed by epitaxial growth, and therefore stresses of the film 102 can be relieved to reduce the bowing of the SiC substrate 101 (10).

Figure 7:
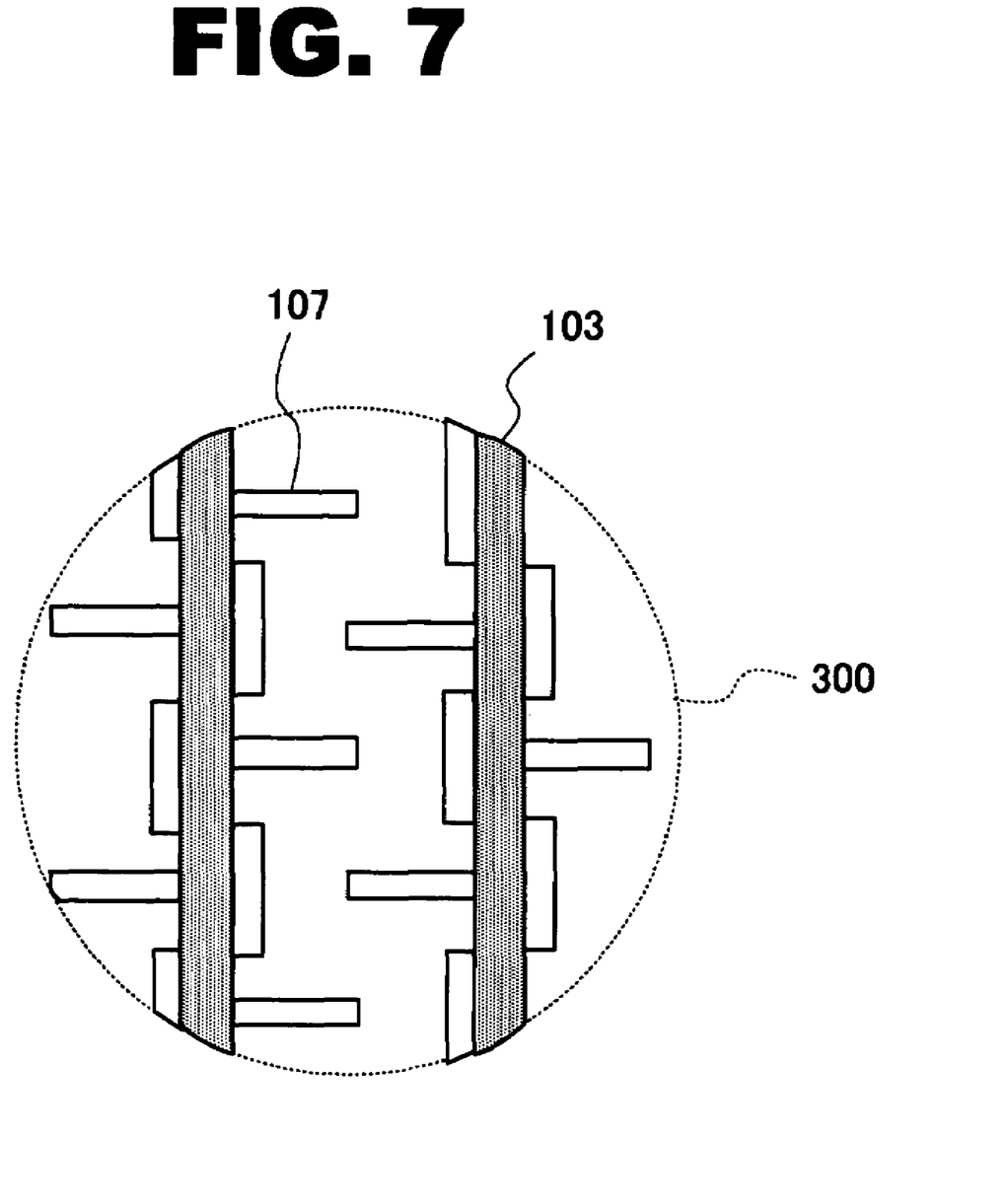
FIG. 7 is a figure showing grooves to be made in a silicon carbide (SiC) film, when a semiconductor wafer on which the SiC film was formed has a concave or convex bowing around the center of the semiconductor wafer. In addition, FIG. 7 enlarges and shows the dotted line circle in FIG. 1.

FIG. 7 is a figure showing arrangement of grooves to be made in a silicon carbide (SiC) film, when a semiconductor wafer on which a SiC film was formed has a concave or convex bowing around the center of the semiconductor wafer. In addition, FIG. 7 enlarges and shows the dotted line circle in FIG. 1. Also, a formation method of the grooves 107 is the same as described.

Next, a second embodiment of the present invention will be described. In this embodiment, a SiC substrate having a SiC film formed by epitaxial growth has, on the SiC substrate, a region in which DiMOS (Double-Implanted MOSFET) is not formed and, crystal defects are concentrated in the region. In this case, the crystal-defect concentrated region is removed by dry etching. FIGS. 8A to 8C, 9D to 9F, and 10G to 10I are cross-sectional views showing the procedure for fabricating the semiconductor device according to Embodiment 2 of the present invention. Also, a shape of grooves 207 made in a silicon carbide 202 is the same as that of Embodiment 1.

Figure 8A:
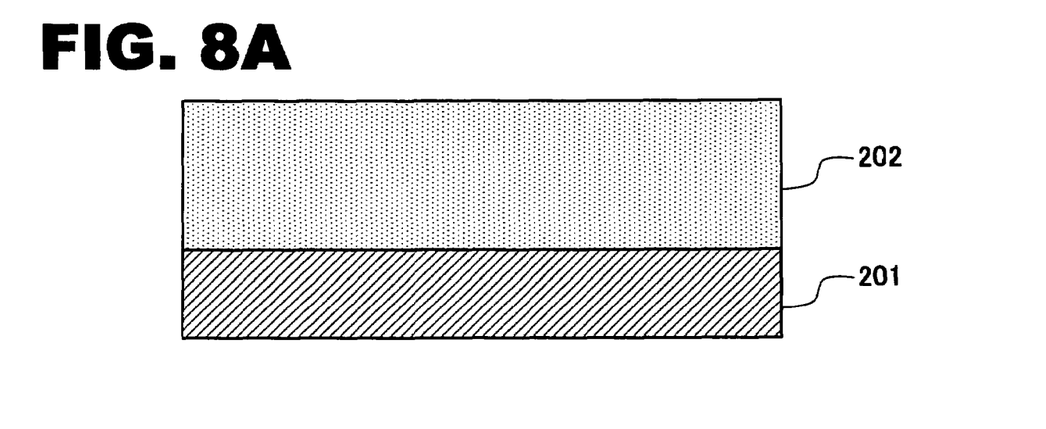
FIGS. 8A to 8C are cross-sectional views showing the procedure for fabricating a semiconductor device according to Embodiment 2 of the present invention.

First, a SiC substrate 201 on which the SiC film 202 was formed is prepared in the process as shown in FIG. 8A. The SiC film 202 is formed with, for example, a thickness of 15 μm (micrometer) by epitaxial growth on the SiC substrate 201. The surface of the SiC film 202 is planarized by etch back process such as chemical mechanical polishing (CMP) or the like.

Figure 8B:
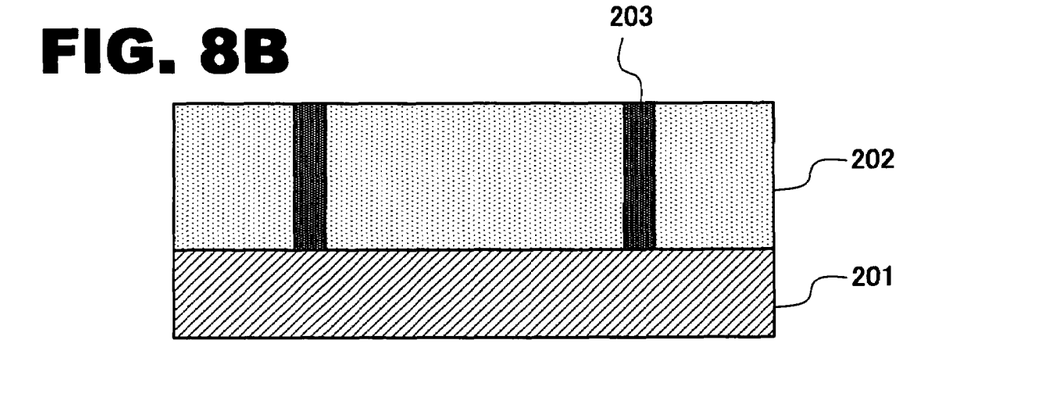

Here, crystal defects such as micropipe, screw dislocation, edge dislocation, and the like are formed in the SiC film 202. Reference numeral 203 (as shown in FIGS. 1 and 8B) indicates the crystal-defect concentrated region 203. Furthermore, the crystal-defect concentrated region 203 can be formed intentionally by a predetermined method. In a SiC single crystal, adjustment of a growth plane can concentrate crystal defects such as dislocation and the like. These crystal defects can be concentrated further during growth of a film. On this account, a region other than a crystal-defect concentrated region becomes a high quality region in which crystal defects such as dislocation and the like are few. In this case, if observed, the crystal-defect concentrated region 203 is shown as FIG. 1.

Figure 8C:
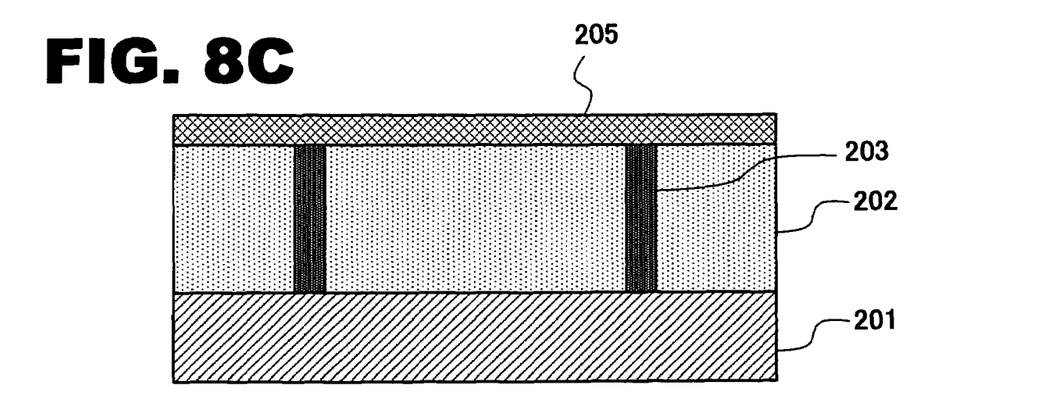

Next, an oxide film 205 with a thickness of 2 μm (micrometer) that is used as mask for making grooves is formed on the SiC film 202 grown on the SiC substrate 201, as shown in FIG. 8C. The oxide film 205 is formed by chemical vapor deposition (CVD) method under a reduced pressure atmosphere at a reactor temperature of 700 degrees C. using a $Si(OC_2H_5)_4$ gas.

Figures 9D, 9E:
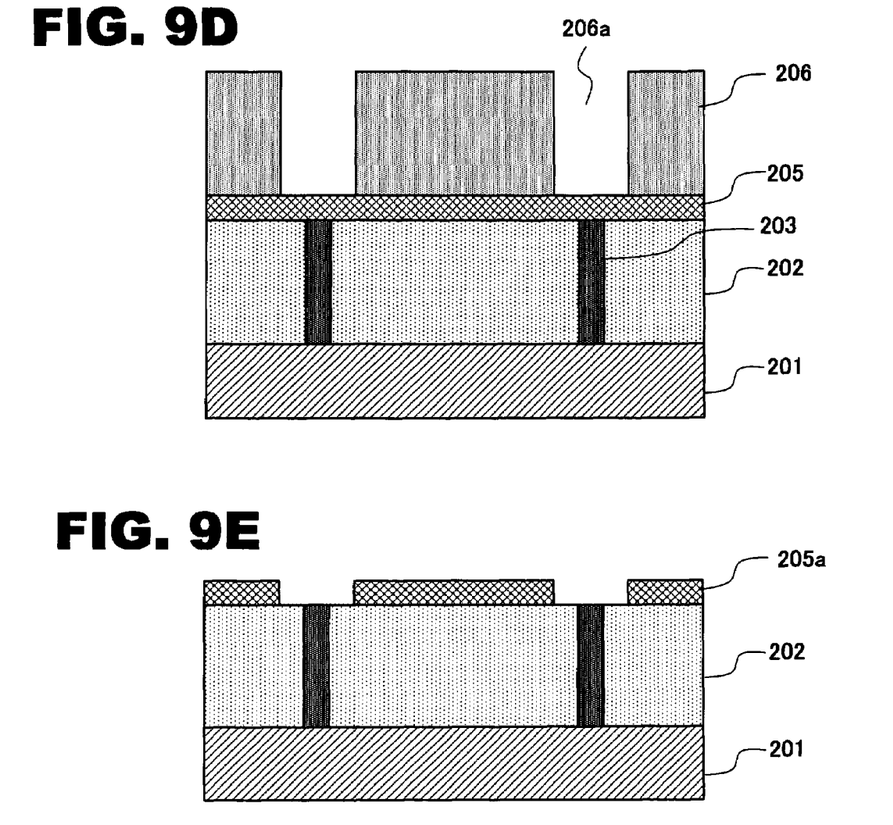
FIGS. 9D to 9F are cross-sectional views showing the procedure for fabricating a semiconductor device according to Embodiment 2 of the present invention.

Subsequently, a resist film 206 is patterned by a photolithography process as shown in FIG. 9D. In this case, an opening part 206a patterned includes also the crystal-defect concentrated region 203, a width of the crystal-defect concentrated region 203 in the SiC film is, for example, around 10 µm (micrometer). Next, in the process as shown in FIG. 9E, an oxide film mask 205a is formed by performing plasma etching via the resist film 206 as mask in mixed gases of $CHF_3$, $CF_4$, and Ar.

Figure 9F:
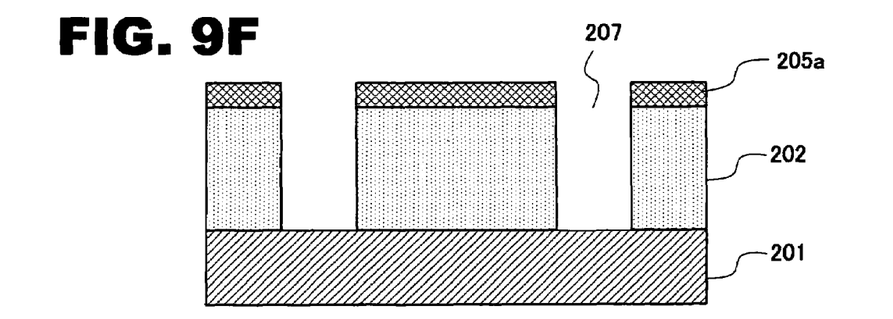

Next, the semiconductor wafer 10 is transferred to another etching apparatus, and then plasma etching is performed via the oxide mask 205a in a $SF_6$ gas. Thereafter, the grooves 207 with, for example, a width of about 12 µm (micrometer) and a depth of about 15 µm (micrometer) are made in a region in which DiMOS (Double-Implanted MOS) is not formed and which exists in the SiC film 202 as shown in FIG. 9F. Therefore, only the high quality region in which crystal defects such as micropipe, screw dislocation, edge dislocation and the like are few is separated by the grooves 207 and is left in the SiC film 202. Then, a resist film by ashing and the oxide film mask 205a by HF is removed.

Figure 10G:
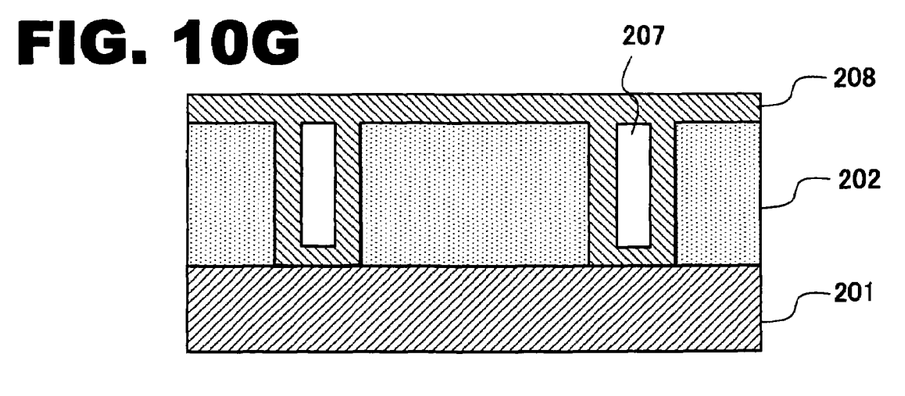
FIGS. 10G to 10I are cross-sectional views showing the procedure for fabricating a semiconductor device according to Embodiment 2 of the present invention.

Then, an oxide film 208 with a thickness of 2 µm (micrometer) is used as mask for dopant implantation is formed on both the SiC substrate 201 and the SiC film 202 that has the grooves 207, in the process as shown in FIG. 10G. A formation method and condition of the oxide film 208 are the same as those of the oxide film 205.

Figure 10H:
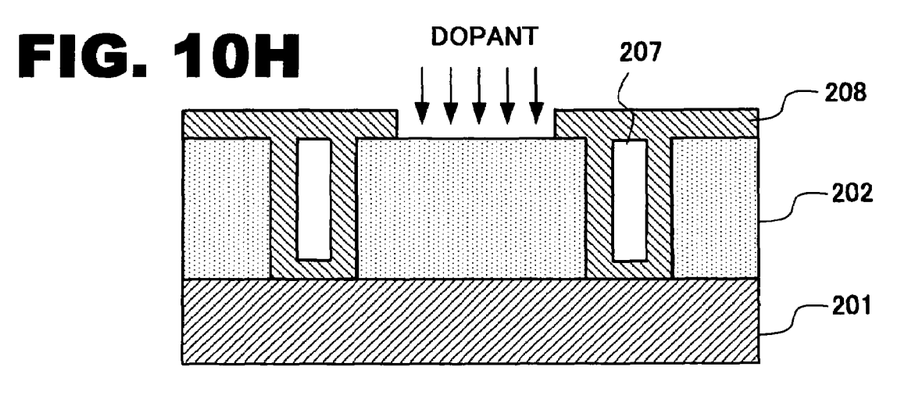

Next, an opening through which dopant implantation is performed is formed in a predetermined region of the oxide film 208 by well-known photolithography and dry etching techniques (as shown in FIG. 10H). Subsequently, multi-step implantation is carried out using nitrogen (N) or phosphorous (P) for an n-type dopant and aluminum (Al) or boron (B) for an p-type dopant, at energies of several tens keV to several tens MeV (as shown in FIG. 10H).

Figure 10I:
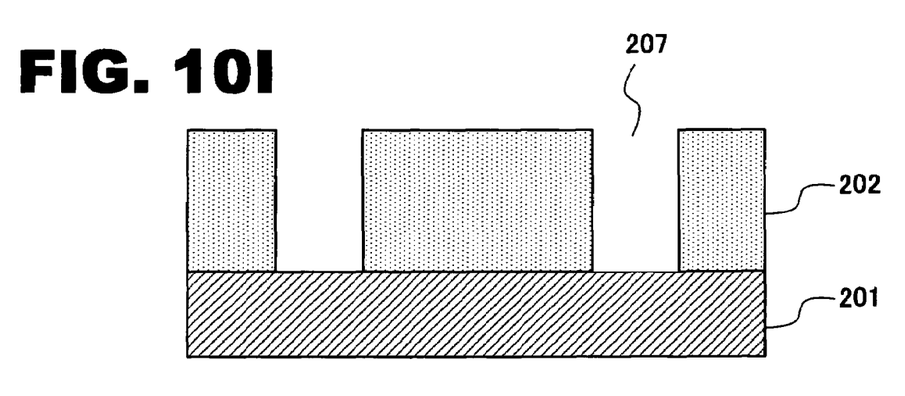

After dopant implantation, the film 208 used as mask for dopant implantation is removed by HF and the process from forming to removing a mask is repeated, as shown in FIG. 10I. As a result, a well or source region is formed. An activating thermal treatment after dopant implantation is performed per each dopant implantation or only after the entire dopant implantation. The treatment condition is at a temperature of 1200 to 1800 degrees C. under an Ar atmosphere for 11 to 30 sec. This treatment restores electrical activation of dopant and damage of an implantation portion in the SiC film 202.

Figure 11A:
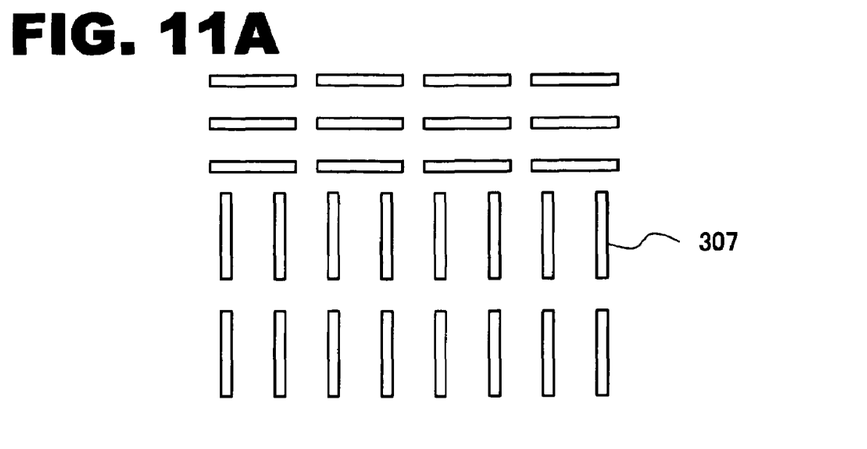
FIG. 11 is a partial plan view showing examples of groove shapes applicable to the present invention.
Figure 11B:
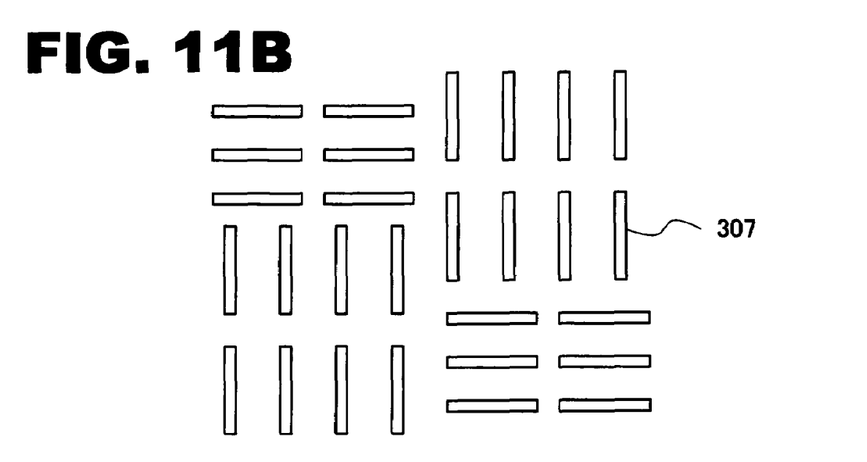

FIG. 11 is a partial plan view showing an example of groove shapes applicable to the present invention. If the semiconductor wafer 10 warps in saddle shape (in ridge shape), the grooves (with the direction of the short side perpendicular to the direction of saddle shape) are made in one direction to the semiconductor wafer 10. On the other hand, when the semiconductor wafer 10 has a concave or convex bowing around the center of the semiconductor wafer 10, the grooves 307 are preferably made with angles thereof alternately at 0 and 90 degree angles as shown in FIGS. 11A and 11B.

Figure 11C:
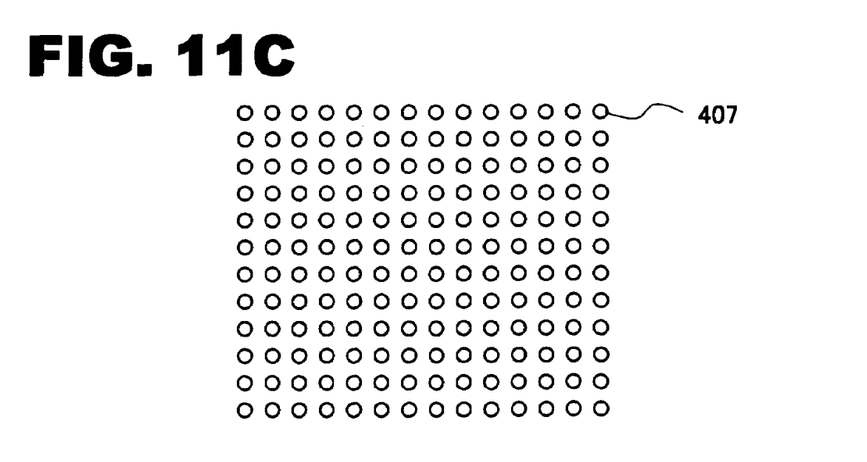

In the above-described embodiment, although the grooves are made in a portion adjacent to a region in which DiMOS (Double-Implanted MOSFET) is not formed, the grooves may be made in any portion other than the portion. Alternatively, in the present invention, holes 407 in place of grooves may be made as shown in FIG. 11C. In this case, a shape of the holes may be not only circular but also polygonal. Also, if it is possible to restrain deformation of the semiconductor wafer 10, recesses that do not penetrate the SiC film 102 may be employed.

As described above, the grooves 307 are made with angles thereof at 0 and 90 degree angles in a SiC film formed by epitaxial growth. Therefore, even when the semiconductor wafer 10 has a concave or convex bowing around the center of the semiconductor wafer 10, stresses of the SiC film can be relieved to reduce a bowing of the semiconductor wafer 10.

What is claimed is:

1. A method for fabricating a semiconductor device including a semiconductor substrate having a silicon carbide (SiC) film, the method comprising:
    forming an SiC film on a semiconductor wafer;
    discriminating a deformation condition of the semiconductor wafer; and
    forming grooves in the SiC film, the grooves having a shape determined in accordance with the deformation condition of the semiconductor wafer and being formed around a crystal-defect concentrated region in the silicon carbide (SiC) film.

2. A method for fabricating the semiconductor device according to claim 1, wherein when a bending or bowing portion, extending in one direction of the semiconductor wafer, is discriminated, a plurality of slit-shaped grooves would be formed to extend substantially perpendicularly to a longitudinal direction in which the bending portion extends.

3. A method for fabricating the semiconductor device according to claim 1, wherein when a concave or convex bending or bowing portion, bowing around the center of the semiconductor wafer, is discriminated, grooves would be formed to include first grooves extending in a first direction, and second grooves extending in a second direction perpendicular to the first direction.

4. A method for fabricating a semiconductor device including a semiconductor substrate having a silicon carbide (SiC) film, the method comprising:
    forming an SiC film on a semiconductor wafer;
    discriminating a deformation condition of the semiconductor wafer; and
    forming grooves in the SiC film, the grooves formed to remove a crystal-defect concentrated region in the silicon carbide (SiC) film.

5. A method for fabricating the semiconductor device according to claim 1, wherein the crystal-defect concentrated region in the silicon carbide (SiC) film is a region having crystal defects more than 104/cm2.

6. A method for fabricating the semiconductor device according to claim 1, wherein the crystal-defect concentrated region is intentionally formed by a predetermined method.

7. A method for fabricating the semiconductor device according to claim 1, wherein the crystal defects include at least one of micropipe, screw dislocation, edge dislocation.

8. A method for fabricating the semiconductor device according to claim 4, wherein when a bending or bowing portion, extending in one direction of the semiconductor wafer, is discriminated, a plurality of slit-shaped grooves would be formed to extend substantially perpendicularly to a longitudinal direction in which the bending portion extends.

9. A method for fabricating the semiconductor device according to claim 4, wherein when a concave or convex bending or bowing portion, bowing around the center of the semiconductor wafer, is discriminated, grooves would be formed to include first grooves extending in a first direction, and second grooves extending in a second direction perpendicular to the first direction.

* * * * *